(12) United States Patent
Kwon et al.

(10) Patent No.: US 10,381,142 B2
(45) Date of Patent: Aug. 13, 2019

(54) CRYOGEN RECONDENSING SYSTEM AND SUPERCONDUCTING MAGNET APPARATUS INCLUDING THE SAME

(71) Applicant: Samsung Electronics Co., Ltd., Suwon-si (KR)

(72) Inventors: Oh-soo Kwon, Seoul (KR); Do-woon Kim, Suwon-si (KR); Jae-hyun Shin, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 448 days.

(21) Appl. No.: 14/489,063

(22) Filed: Sep. 17, 2014

(65) Prior Publication Data
US 2015/0080222 A1 Mar. 19, 2015

(30) Foreign Application Priority Data
Sep. 17, 2013 (KR) ........................ 10-2013-0112070

(51) Int. Cl.
*F25B 9/00* (2006.01)
*F25B 9/10* (2006.01)
*F25B 9/14* (2006.01)
*F17C 3/08* (2006.01)
*H01F 6/04* (2006.01)
*H01F 6/06* (2006.01)
(Continued)

(52) U.S. Cl.
CPC ................ *H01F 6/04* (2013.01); *F17C 5/04* (2013.01); *F25D 3/10* (2013.01); *G01R 33/3804* (2013.01); *H01F 6/06* (2013.01); *F25B 9/145* (2013.01); *F25B 2400/17* (2013.01); *G01R 33/3815* (2013.01)

(58) Field of Classification Search
CPC .... F25B 9/00; F25B 9/014; F25B 9/10; F25B 9/12; F25B 9/14; F25B 9/145; F17C 2203/0308; F17C 2203/0316; F17C 3/08; F17C 3/085; H01F 6/04; H01F 6/06
See application file for complete search history.

(56) References Cited

U.S. PATENT DOCUMENTS 6,107,905 A 8/2000 Itoh et al.
7,053,740 B1 5/2006 Laskaris et al.
(Continued)

FOREIGN PATENT DOCUMENTS

JP 2001004236 A * 1/2001
KR 10-2013-0090565 A 8/2013

OTHER PUBLICATIONS

Communication dated Feb. 2, 2015 by the European Patent Office in related application No. 14185206.1.
(Continued)

*Primary Examiner* — Frantz F Jules
*Assistant Examiner* — Erik Mendoza-Wilkenfel
(74) *Attorney, Agent, or Firm* — Sughrue Mion, PLLC

(57) ABSTRACT

Provided are a cryogen recondensing system and a superconducting magnet apparatus including the same. The cryogen recondensing system includes a primary reservoir that stores cryogen for cooling a superconducting coil; a refrigerator that recondenses gas cryogen of cryogen stored in the primary reservoir; a secondary reservoir that stores gas cryogen; and a secondary reservoir tube that connects the primary reservoir to the secondary reservoir, through which the gas cryogen flows.

19 Claims, 9 Drawing Sheets

(51) Int. Cl.
    *G01R 33/38*     (2006.01)
    *F17C 5/04*     (2006.01)
    *F25D 3/10*     (2006.01)
    *G01R 33/3815*     (2006.01)

(56) References Cited

U.S. PATENT DOCUMENTS

| | | | |
|---|---|---|---|
| 2003/0112106 A1* | 6/2003 | Watanabe | F17C 13/087 335/299 |
| 2006/0022779 A1* | 2/2006 | Jiang | H01F 6/04 335/216 |
| 2007/0101742 A1* | 5/2007 | Laskaris | G01R 33/3804 62/259.2 |
| 2007/0271933 A1* | 11/2007 | Miki | C01B 3/0089 62/51.1 |
| 2009/0254227 A1* | 10/2009 | Tsuda | G01R 33/3804 700/300 |
| 2011/0101982 A1* | 5/2011 | Huang | F25D 19/00 324/318 |
| 2012/0196753 A1* | 8/2012 | Laskaris | F25D 19/00 505/163 |
| 2013/0104570 A1* | 5/2013 | Stautner | G01R 33/3804 62/45.1 |
| 2013/0203603 A1 | 8/2013 | Harrison | |
| 2014/0202174 A1* | 7/2014 | Wang | F25B 9/14 62/6 |

OTHER PUBLICATIONS

Communication dated Oct. 26, 2015, issued by the Korean Intellectual Property Office in corresponding Korean Application No. 10-2014-0123714.

\* cited by examiner

CRYOGEN RECONDENSING SYSTEM AND SUPERCONDUCTING MAGNET APPARATUS INCLUDING THE SAME

CROSS-REFERENCE TO RELATED APPLICATION

This application claims priority from Korean Patent Application No. 10-2013-0112070, filed on Sep. 17, 2013, in the Korean Intellectual Property Office, the disclosure of which is incorporated herein in its entirety by reference.

BACKGROUND

1. Field

Apparatuses and methods consistent with the exemplary embodiments relate to a cryogen recondensing system and a superconducting magnet apparatus including the same, and more particularly, to a cryogen recondensing system having an improved cryogen reservoir for recondensation of cryogen and a superconducting magnet apparatus including the same.

2. Description of the Related Art

A superconducting magnet apparatus, such as a magnetic resonance imaging (MRI) apparatus or a nuclear magnetic resonance (NMR) apparatus, uses a superconducting coil. Since the superconducting coil maintains a superconducting phenomenon at an extremely low temperature, such as 4.2 K, a cooling system is required to maintain such an extremely low temperature. A commercialized cooling system generally cools the superconducting coil using liquid helium.

On the other hand, in a superconducting magnet apparatus, such as an MRI apparatus, heat is generated from the cryogen reservoir or the superconducting coil due to Joule's heat caused by an eddy current during operation of the superconducting magnet apparatus, such as during MRI imaging. Liquid cryogen evaporates while cooling the heat and gas cryogen is stored in a cryogen reservoir, thereby increasing pressure within the cryogen reservoir. A recondensing cooling system is used in order to prevent the cryogen within the superconducting magnet apparatus from decreasing because of cryogen evaporation. The recondensing cooling system liquefies high-pressured gas cryogen stored in the cryogen reservoir using a refrigerator, thereby preventing a decrease in the amount of cryogen, within the superconducting magnet apparatus, through circulation between evaporation and liquefaction.

Since an existing thermosyphon type recondensing cooling system is required to be located in an upper portion of a superconducting coil, the size of a cryogen reservoir is limited. In addition, in order to store as much cryogen as possible in the cryogen reservoir, the amount of space for storing gas cryogen decreases. In order to resolve the space limitation of the cryogen reservoir, the cryogen reservoir protrudes upwardly from the superconducting magnet apparatus.

SUMMARY

One or more exemplary embodiments include a cryogen recondensing system which secures a storage space for evaporated cryogen and a superconducting magnet apparatus including the same.

Additional aspects will be set forth in part in the description which follows and, in part, will be apparent from the description, or may be learned by practice of the exemplary embodiments.

According to one or more exemplary embodiments, a cryogen recondensing system includes: a primary reservoir configured to store cryogen for cooling a superconducting coil, a refrigerator configured to recondense gas cryogen of cryogen stored in the primary reservoir, a secondary reservoir configured to store gas cryogen, and a secondary reservoir tube configured to connect the primary reservoir to the secondary reservoir, wherein the gas cryogen flows through the secondary reservoir tube.

The secondary reservoir may be located at a position lower than the primary reservoir.

The primary reservoir may include a primary reservoir-side inlet-outlet port connected to the secondary reservoir tube, and wherein the primary reservoir-side inlet-outlet port may be located at a position higher than a pre-designated highest water level of liquid cryogen in the primary reservoir.

The secondary reservoir tube may have a pipe shape. The secondary reservoir tube may be formed by extending a part of the primary or secondary reservoir.

A single secondary reservoir tube or a plurality of secondary reservoir tubes may be provided.

A single secondary reservoir or a plurality of secondary reservoirs may be provided.

The cryogen recondensing system may further include a check valve that is located in the primary reservoir and is configured to open at a predetermined pressure.

In an aspect of the invention, the cryogen may be any one of helium, neon, oxygen, hydrogen, and nitrogen.

According to one or more exemplary embodiments, a superconducting magnet apparatus includes a superconducting coil, and a cooling system that includes a cryogen recondensing system and is configured to cool the superconducting coil, wherein the cryogen recondensing system includes a primary reservoir configured to store cryogen for cooling the superconducting coil, a refrigerator configured to recondense gas cryogen of cryogen stored in the primary reservoir, a secondary reservoir that stores gas cryogen, and a secondary reservoir tube configured to connect the primary reservoir to the secondary reservoir, wherein the gas cryogen flows through the secondary reservoir tube.

The cooling system may include a superconducting coil cooler through which the cryogen flows and is configured to thermally contact the superconducting coil and is configured to cool the superconducting coil, and a superconducting coil cooler tube which is configured to connect the primary reservoir to the superconducting coil cooler.

The superconducting coil cooler may operate according to a thermosyphon method.

The cooling system may further include a low-temperature container configured to receive the cryogen, and wherein the superconducting coil is received and cooled in the low-temperature container.

The primary reservoir through which gas cryogen flows may be connected to a first low-temperature container tube which is spatially separated from the low-temperature container and wherein the primary reservoir is connected to a second low-temperature container tube through which recondensed liquid cryogen flows.

The low-temperature container may be integrated with the primary reservoir.

The superconducting magnet apparatus may further include a heat shield portion configured to thermally shield the superconducting coil from external conditions, and the primary reservoir and the secondary reservoir may be located within the heat shield portion.

The superconducting coil may have a cylindrical shape of which a central axis is placed in a horizontal direction.

The secondary reservoir may be located along a circumference of the superconducting coil.

The superconducting coil may have a cylindrical shape in which a central axis of the superconducting coil is positioned in a vertical direction.

The superconducting magnet apparatus may be a magnetic resonance imaging apparatus.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
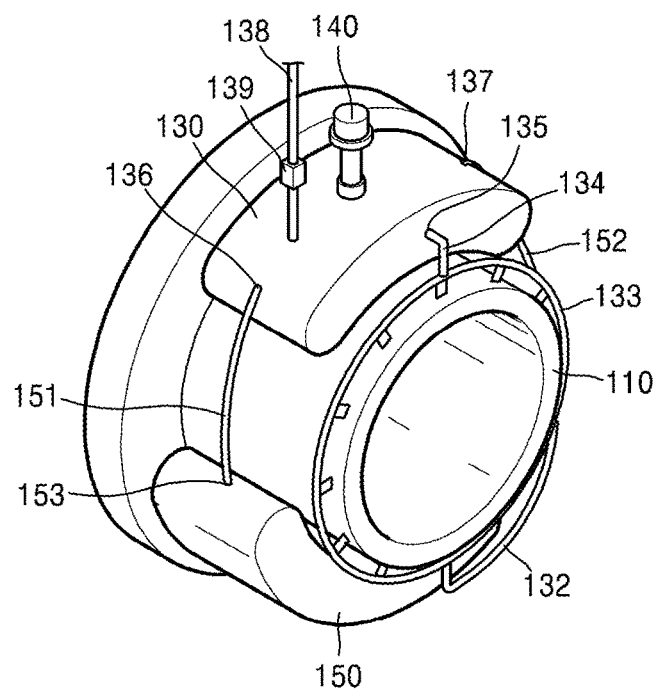
FIG. 1 schematically illustrates a configuration of a cryogen recondensing system according to an exemplary embodiment.

Reference will now be made in detail to exemplary embodiments, examples of which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, exemplary embodiments will be described in detail with reference to the accompanying drawings. In the drawings, like reference numerals denote like elements, and the sizes or thicknesses of elements may be exaggerated for clarity.

Figure 2:
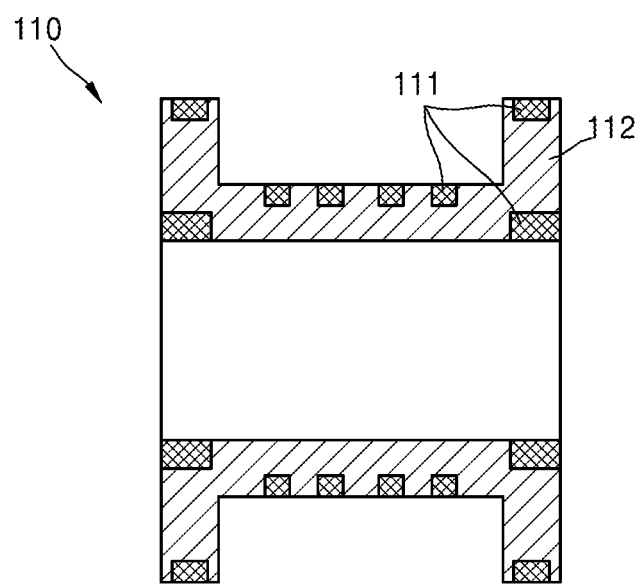
FIG. 2 is a schematic longitudinal section view showing a structure of a superconducting magnet cooled by the cryogen recondensing system.
Figure 3:
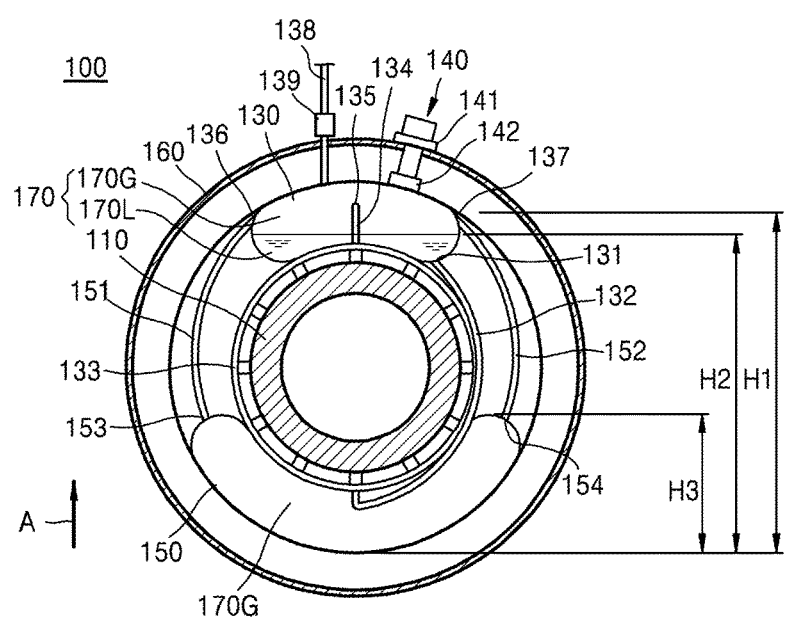
FIG. 3 is a schematic front cross-sectional view of a superconducting magnet apparatus including the cryogen recondensing system of FIG. 1.

FIG. 1 schematically illustrates a configuration of a cryogen recondensing system according to an exemplary embodiment. FIG. 2 is a schematic longitudinal section view showing a structure of a superconducting magnet cooled by the cryogen recondensing system. FIG. 3 is a schematic front cross-sectional view of a superconducting magnet apparatus including the cryogen recondensing system of FIG. 1.

Referring to FIGS. 1, 2 and 3, the superconducting magnet apparatus 100 includes a superconducting coil 110. The superconducting coil 110 may be formed by, for example, winding a superconducting wire 111 around a cylindrical former 112. The former 112 may have a shape, for example, both ends of the superconducting coil 110 have a larger radius than that of a middle of the superconducting coil 110. FIG. 2 may be understood such as one end of the superconducting coil 110 is omitted for convenience of illustration. The former 112 support the superconducting wire 111 to maintain the shape of the superconducting wire 111. When current is applied to the superconducting coil 110, a superconducting magnet is formed. The superconducting wire 111 may be divided into a plurality of parts (for example, seven to ten parts) along the length direction and/or diameter direction of the former 112 so that a uniform electromagnetic field is formed around the center of the cylinder. The superconducting coil 110 is located inside of the heat shield portion 160 and is thermally shielded from external conditions. Furthermore, a vacuum container (not illustrated) may be provided outside of the heat shield portion 160.

The superconducting magnet apparatus 100 cools the superconducting coil 110 and includes a cooling system using a cryogen recondensing method. The cooling system maintains the superconducting coil 110 at a temperature equal to or lower than a threshold temperature in order to maintain the superconducting characteristics of the superconducting coil 110. The cooling system of the exemplary embodiment is an indirect cooling type and includes a primary reservoir 130 that stores cryogen 170 and a superconducting coil cooling module 133 that thermally contacts the superconducting coil 110 and cools the superconducting coil 110.

The primary reservoir 130 may be located at the upper portion of the superconducting coil 110 for example, in a vertical direction A. The primary reservoir 130 functions as a recondensing portion for recondensing the evaporated cryogen 170G into the liquid cryogen 170L as described below. The liquid cryogen 170L is used to cool the superconducting coil 110 so that the temperature of the superconducting coil 110 will be equal to or lower than a threshold temperature. The liquid cryogen 170L may be, for example, liquid helium, neon, hydrogen, oxygen, nitrogen, etc according to a material of the superconducting wire 111. For example, the liquid cryogen 170L may be helium in case of the superconducting wire 111 formed of a NbTi superconductor, and the liquid cryogen 170L may be neon, hydrogen, oxygen or nitrogen in case of the superconducting wire 111 formed of a high temperature superconductor.

The superconducting coil cooling module 133 may be a heat-exchange tube through which the liquid cryogen 170L flows. The contact portion with the superconducting coil 110 may be formed of a high heat conductivity material, such as aluminum or copper. The superconducting coil cooling module 133 contacts the superconducting coil 110 and thermally contacts the superconducting wire 111 and the former 112 of the superconducting coil 110 so as to cool the superconducting coil 110. The superconducting coil cooling module 133 may be located in the former 120 that supports the superconducting coil 110 for thermal contact and may cool the former 120.

The superconducting coil cooling module 133 and the primary reservoir 130 are connected to tubes for the superconducting coil cooling module upstream and downstream of the superconducting coil cooling module 133. As used herein, the term "connected" means that there is a connection such that liquid or gas cryogen 170 can flow. A connection method is not limited to a specific embodiment. The upstream-side tube 132 for the superconducting coil cooling module may be connected to the superconducting coil cooling module 133 at the lower portion of the superconducting coil 110 and the downstream-side tube 134 for the superconducting coil cooling module may be connected to the superconducting coil cooling module 133 at the upper portion of the superconducting coil 110.

Furthermore, an outlet 131 of the primary reservoir 130 that is connected to the upstream-side tube 132 for the superconducting coil cooling module may be located at a place lower than an inlet 135 of the primary reservoir 130 that is connected to the downstream-side tube 134 for the superconducting coil cooling module. The cryogen 170 may be circulated between the primary reservoir 130 and the superconducting coil cooling module 133 according to a thermosyphon method. The exemplary embodiment does not exclude, for example, the circulation of the cryogen 170 using a separate mechanical pump.

The liquid cryogen 170L of the primary reservoir 130 is introduced into the superconducting coil cooling module 133 through the upstream-side tube 132 for the superconducting coil cooling module and is returned into the primary reservoir 130 through the downstream-side tube 134 for the superconducting coil cooling module while absorbing heat generated from the superconducting coil 110. Some or all of the liquid cryogen 170L that has absorbed heat from the superconducting coil cooling module 133 may evaporate, and thus, the lower liquid cryogen 170L and the upper gas cryogen 170G may exist together inside of the primary reservoir 130.

Figure 11:
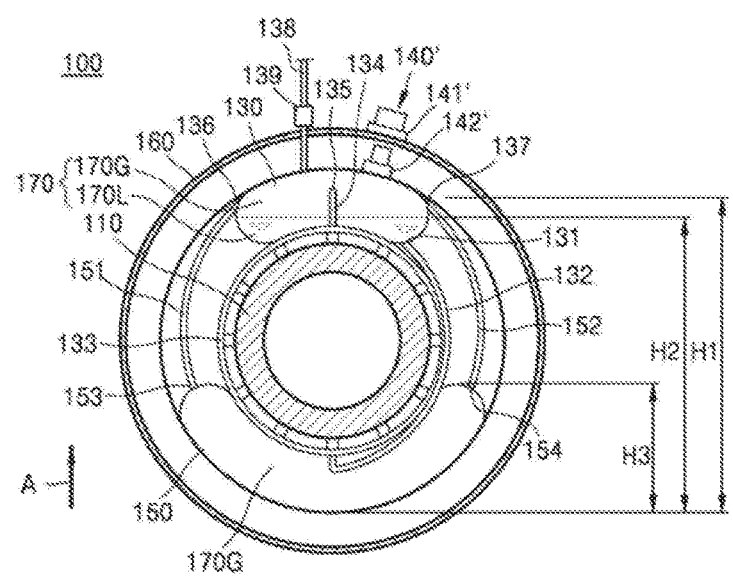
FIG. 11 is a schematic longitudinal section view showing a structure of a superconducting magnet cooled by the cryogen recondensing system according to another exemplary embodiment.

The primary reservoir 130 is cooled by a refrigerator 140. The refrigerator 140 may be a two-stage refrigerator having a first stage 141 which is a high temperature end and a second stage 142 which is a low temperature end. The first stage 141 and the second stage 142 of the refrigerator 140 operate at different temperatures. For example, the first stage 141 may operate at 40 to 50 K, and the second stage 142 may operate at 4K. The first stage 141 of the refrigerator 140 thermally contacts the heat shield portion 160 and cools the heat shield portion 160, and the second stage 142 thermally contacts the primary reservoir 130 and cools the primary reservoir 130 to re-condense the gas cryogen 170G. The contact portion between the primary reservoir 130 and the second stage 142 of the refrigerator 140 may be formed of a high heat conductivity material. The second stage 142 of the refrigerator 140 is inserted inside of the primary reservoir 130 and may directly contact the gas cryogen 170G. The refrigerator 140 cools only the primary reservoir 130, and a separate refrigerator may be provided to cool the heat shield portion 160. For example, as shown in FIG. 11, a refrigerator 140' includes a first refrigerator 141' that cools only the primary reservoir 130 and a second refrigerator 142' that cools the heat shield portion 160. The refrigerator 140 or 140' may be a well-known refrigerator, such as a Gifford-McMahon (GM) refrigerator or a pulse tube refrigerator.

The primary reservoir 130 and the refrigerator 140 constitute a cryogen recondensing system. The cryogen 170L that is re-condensed by the refrigerator 140 and that becomes liquid is circulated by a superconducting coil cooling module 133.

The cryogen recondensing system according to the exemplary embodiment further includes a secondary reservoir 150 that can additionally store the gas cryogen 170G. The primary reservoir 130 and the secondary reservoir 150 are located inside of the heat shield portion 160 along with the superconducting coil 110 and may be thermally shielded by the heat shield portion 160 from external conditions. The secondary reservoir 150 is spatially separated from the primary reservoir 130 and is connected to the primary reservoir 130 through the secondary reservoir tube 151 and the secondary reservoir tube 152. The secondary reservoir tube 151 and the secondary reservoir tube 152 may have a pipe shape. The primary reservoir 130 and the secondary reservoir 150 may be spatially separated from the heat shield portion 160, as shown in FIG. 3.

The primary reservoir 130 includes an inlet-outlet port 136 and an inlet-outlet port 137 which are connected to the secondary reservoir tube 151 and the secondary reservoir tube 152, respectively. The height H1 of the primary reservoir-side inlet-outlet port 136 and inlet-outlet port 137 may be designed to be higher than the predetermined highest water level H2 of the liquid cryogen 170L of the primary reservoir 130. Therefore, the gas cryogen 170G is only introduced into the secondary reservoir 150. A case where the liquid cryogen 170L is introduced into the secondary reservoir 150 is not excluded. When the liquid cryogen 170L is introduced into the secondary reservoir 150, the cryogen 170L naturally evaporates inside of the secondary reservoir 150.

The secondary reservoir 150 may be located in the lower portion of the primary reservoir 130. Specifically, the height H3 of the secondary reservoir-side inlet-outlet port 153 and inlet-outlet port 154 may be designed to be lower than the height of the primary reservoir-side inlet-outlet port 136 and inlet-outlet port 137. Furthermore, the secondary reservoir 150 may be located along the outer circumference of the superconducting coil 110. The secondary reservoir 150 may be located in the non-occupied space within the heat shield portion 160 without changing the appearance of the heat shield portion 160. Although the case in which the secondary reservoir tube 151 and secondary reservoir tube 152 are provided at both sides of the secondary reservoir 150 are shown in FIG. 3, exemplary embodiments are not limited thereto. The secondary reservoir tube 151 or the secondary reservoir tube 152 may be provided at one side of the secondary reservoir 150 or at more than three different locations.

A tube (not illustrated) used to introduce into the superconducting magnet apparatus 100 and a tube 138 used to exhaust the cryogen 170 outside the superconducting magnet apparatus 100 may be provided in the primary reservoir 130 and a check valve 139 that opens when an internal pressure reaches a predetermined pressure may be provided in the tube 138. When the pressure of the primary reservoir 130 is equal to or higher than a pressure at which the check valve 139 will open, the check valve 139 opens and exhausts the gas cryogen 170G, thereby suppressing the pressure of the primary reservoir 130 from increasing so as to prevent damage to the primary reservoir 130.

When the gas cryogen 170G which is introduced into the primary reservoir 130, exceeds the capability of the cryogen recondensing system due to for example, high heat generated by the superconducting coil 110, the internal pressure of the primary reservoir 130 increases. Since the secondary reservoir 150 is connected to the primary reservoir 130 through the secondary reservoir tube 151 and the secondary reservoir tube 152, the secondary reservoir 150 divides the internal pressure of the primary reservoir 130, thereby relieving the increased internal pressure which occurs due to the introduction of the gas cryogen 170G which exceeds the capability of the cryogen recondensing system. That is, the secondary reservoir 150 performs the function of a buffer, and thus, the gas cryogen 170G can be received until reaching the predetermined pressure level at which the check valve 139 operates. Therefore, a loss in the cryogen 170 can be suppressed.

As described above, when the primary reservoir 130 is mounted at the upper portion of the superconducting coil 110 within the heat shield portion 160, the mounting space of the primary reservoir 130 is limited. On the other hand, since the liquid cryogen 170L and the gas cryogen 170G exist within the primary reservoir 130, the storage capability for the liquid cryogen 170L and the storage capability for the gas cryogen 170G are in a trade-off relationship. In the primary reservoir 130, the storage capability of the liquid cryogen 170L is large in order to stably cool the superconducting coil 110 whereas the storage capability of the gas cryogen 170G is large in order to minimize a loss in the cryogen 170.

In the cryogen recondensing system of the exemplary embodiment, the secondary reservoir 150 which stores the gas cryogen 170G is provided separately in the non-occupied space within the heat shield portion 160. Therefore, the storage capability for storing the liquid cryogen 170L of the primary reservoir 130 is increased while sufficiently securing the storage capability for the gas cryogen 170G.

Figure 4:
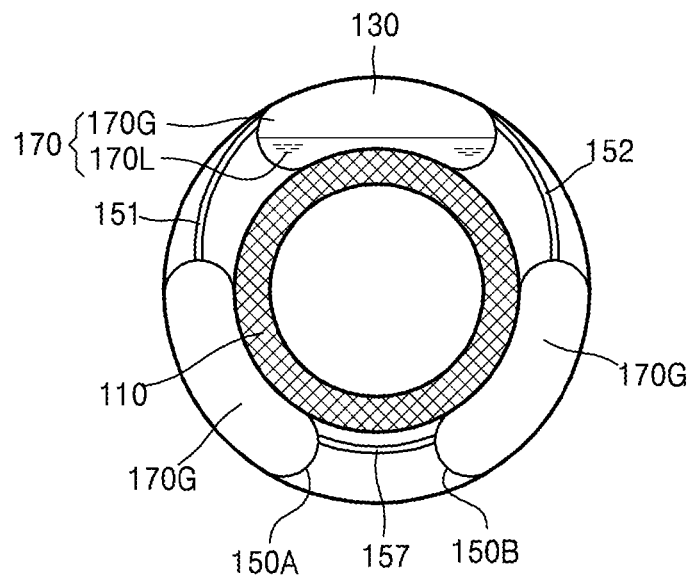
FIG. 4 schematically illustrates a cryogen recondensing system according to another exemplary embodiment.

Although the case in which one secondary reservoir 150 is provided is described as an example in the above-described exemplary embodiment, exemplary embodiments are not limited thereto. FIG. 4 schematically illustrates a cryogen recondensing system according to another exemplary embodiment. As illustrated in FIG. 4, there are a plurality of secondary reservoirs, such as secondary reservoir 150A and secondary reservoir 150B. Furthermore, the plurality of secondary reservoirs, such as secondary reservoir 150A and secondary reservoir 150B, may be located along the outer circumference of the superconducting coil 110. At least one of the plurality of secondary reservoirs 150A and 150B is connected to the primary reservoir 130 through secondary reservoir tube 151 and secondary reservoir tube 152.

In addition, the plurality of reservoirs 150A and 150B may be connected to each other through a tube 157. When the plurality of secondary reservoirs 150A and 150B are both connected to the primary reservoir 130, the tube 157 that connects the secondary reservoirs 150A and 150B to each other may be omitted. Further, although a check valve, a superconducting coil, and a refrigerator module are omitted for convenience of illustration in FIG. 4, they may be mounted like the above-described exemplary embodiment.

Figure 5:
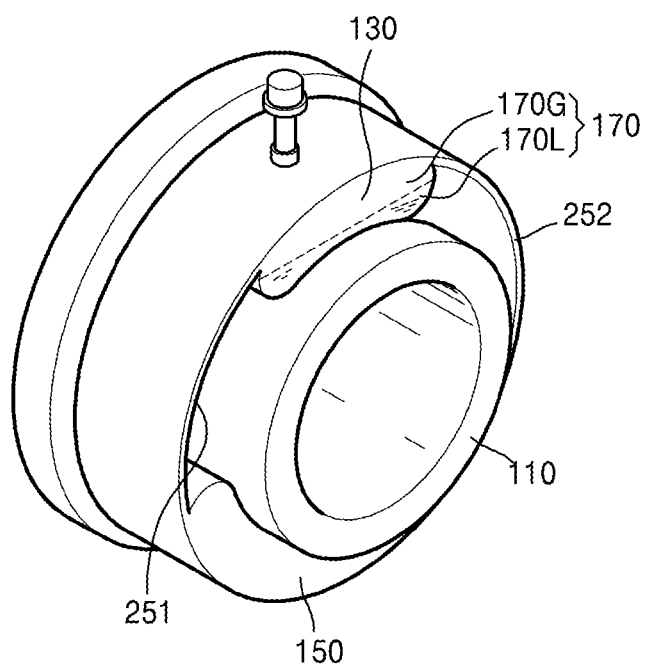
FIG. 5 schematically illustrates a cryogen recondensing system according to another exemplary embodiment.

Although the secondary reservoir tube 151 and the secondary reservoir tube 152 that connect the primary reservoir 130 to the secondary reservoir 150 are described as having a pipe shape in the above-described exemplary embodiment, exemplary embodiments are not limited thereto. FIG. 5 schematically illustrates a cryogen recondensing system according to another exemplary embodiment. As illustrated in FIG. 5, the secondary reservoir tube 251 and the secondary reservoir tube 252 may have a structure extending from the primary reservoir 130 or the secondary reservoir 150. Further, although a check valve, a superconducting coil, and a refrigerator module are omitted for convenience of illustration in FIG. 4, they may be mounted like the above-described exemplary embodiment.

Figure 6:
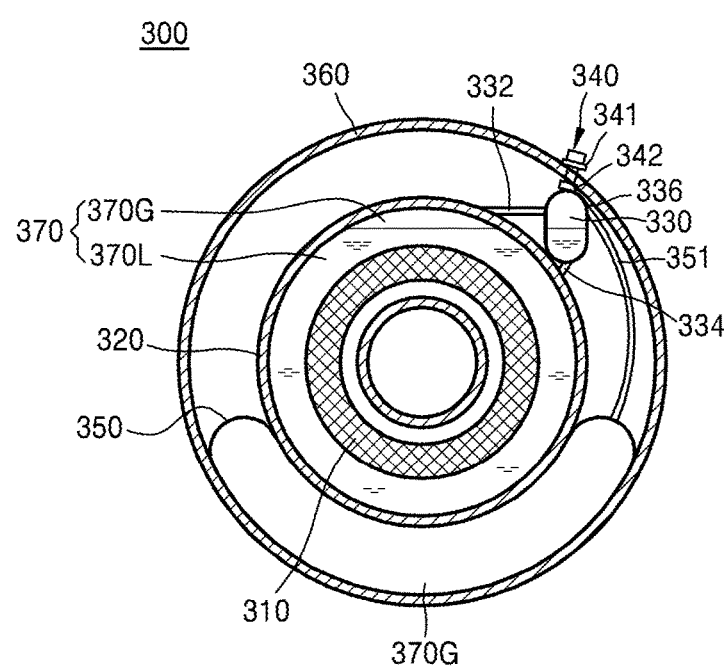
FIG. 6 schematically illustrates a superconducting magnet apparatus including a cryogen recondensing system according to another exemplary embodiment.

FIG. 6 schematically illustrates a superconducting magnet apparatus 300 including a cryogen recondensing system according to another exemplary embodiment.

Referring to FIG. 6, the superconducting magnet apparatus 300 includes a superconducting coil 310 and a cooling system that cools the superconducting coil 310. The superconducting coil 310 is located inside of a heat shield portion 360 so as to be thermally shielded from external conditions. Furthermore, a vacuum container (not illustrated) may be provided outside of the heat shield portion 360.

The cooling system of the exemplary embodiment employs a direct cooling method, such as, a bath type, in which liquid cryogen 370L directly cools the superconducting coil 310 and includes a low-temperature container 320 in which the liquid cryogen 370L is received. The low-temperature container 320 includes the liquid cryogen 370L and the gas cryogen 370G. The superconducting coil 310 is placed under the water level of the liquid cryogen 370L within the low-temperature container 320. The liquid cryogen 370L cools the superconducting coil 310 to be equal to or lower than a threshold temperature and may be, for example, liquid helium, liquid neon, liquid hydrogen, liquid oxygen, liquid nitrogen, etc. Heat generated from the superconducting coil 310 is transferred to the liquid cryogen 370L and the liquid cryogen 370L evaporates. Therefore, gas cryogen 370G may be collected in the upper portion of the inside of the low-temperature container 320.

In addition, the cooling system of the exemplary embodiment includes a primary reservoir 330, that is spatially separated from the low-temperature container 320 and re-condenses the gas cryogen 370G, and a refrigerator 340 that cools the primary reservoir 330.

At least a part of the primary reservoir 330 is located at a higher position than the water level of the liquid cryogen 370L within the low-temperature container 320. For example, the primary reservoir 330 may be located at an upper portion of the superconducting coil 310. The low-temperature container 320 and the primary reservoir 330 are connected to first tube 332 and second tube 334 for low-temperature containers. The first tube 332 for low-temperature containers connects the upper portion of the low-temperature container 320 that corresponds to the water level of the liquid cryogen 370L to the upper portion of the primary reservoir 330, thereby becoming a passage for the gas cryogen 370G. The second tube 334 for low-temperature containers connects the side or lower portion of the low-temperature container 320 which is lower than the water level of the liquid cryogen 370L to the bottom of the primary reservoir 330, thereby becoming a passage for the liquid cryogen 370L.

The primary reservoir 330 is cooled by a refrigerator 340. The refrigerator 340 may be a two-stage refrigerator as discussed above. The first stage 341 of the refrigerator 340 thermally contacts the heat shield portion 360 and cools the heat shield portion 360, and the second stage 342 thermally contacts the primary reservoir 330 and cools the primary reservoir 330 to re-condense the gas cryogen 370G. The second stage 342 of the refrigerator 340 is inserted inside of the primary reservoir 330 and directly contacts the gas cryogen 370G. The refrigerator 340 cools only the primary reservoir 330, and a separate refrigerator may be provided to cool the heat shield portion 360.

The primary reservoir 330 and the refrigerator 340 constitute a cryogen recondensing system. The cryogen recondensing system according to the exemplary embodiment further includes a secondary reservoir 350 that additionally stores the gas cryogen 370G. The primary reservoir 330 and the secondary reservoir 350 are located in the internal space between the low-temperature container 320 and the heat shield portion 360 and may be thermally shielded by the heat shield portion 360 from the external conditions. The secondary reservoir 350 may be located at the lower portion of the primary reservoir 330. Furthermore, the secondary reservoir 350 may be located along the outer circumference of the low-temperature container 320. The secondary reservoir 350 may be located in the non-occupied space within the heat shield portion 360 without changing the appearance of the heat shield portion 360. Although a case in which one secondary reservoir 350 is provided is illustrated in FIG. 6, a plurality of secondary reservoirs may be provided. The secondary reservoir 350 is spatially separated from the primary reservoir 330 and is connected to the primary reservoir 330 through a secondary reservoir tube 351. The secondary reservoir tube 351 may have a pipe shape and may be formed to extend from the primary reservoir 330 and the secondary reservoir 350. Although one secondary reservoir tube 351 is provided in the secondary reservoir 350 shown in FIG. 6, a plurality of secondary reservoir tubes may be provided.

A primary reservoir-side inlet-outlet port 336 connected to the secondary reservoir tube 351 is provided in the primary reservoir 330. The primary reservoir-side inlet-outlet port 336 may be positioned at a location higher than the pre-designated highest water level of the liquid cryogen 370L of the primary reservoir 330. Although not illustrated, a tube (not illustrated) used to introduce to the superconducting magnet apparatus 300 or a tube (not illustrated) used to exhaust the cryogen 370 outside the superconducting magnet apparatus 300 may be provided in the primary reservoir 330 and a check valve (not illustrated) that opens when an internal pressure reaches a predetermined pressure may be provided in the tube used to exhaust the cryogen 370 like the above-described exemplary embodiment.

Like the above-described exemplary embodiment, the secondary reservoir 350 enables the storage capability for the gas cryogen 670G to be larger so as to exceed the capability of the cryogen recondensing system, thereby suppressing a loss in the cryogen 370.

Figure 7:
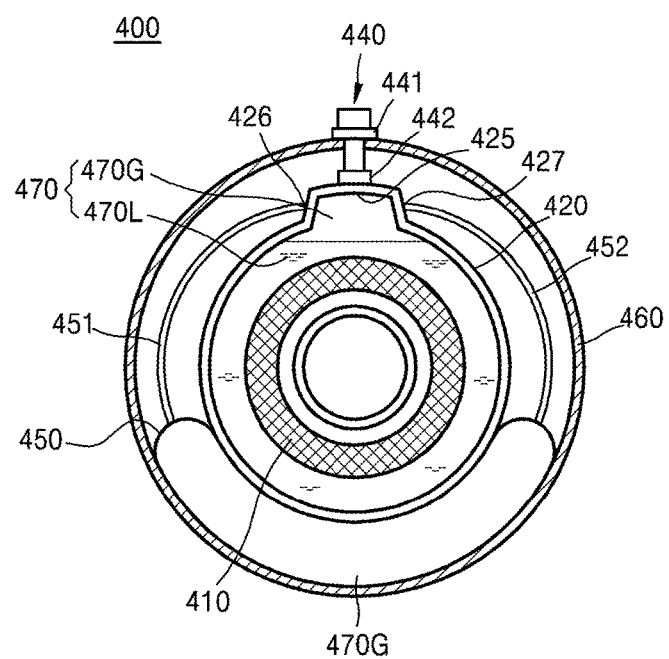
FIG. 7 schematically illustrates a superconducting magnet apparatus including a cryogen recondensing system according to another exemplary embodiment.

FIG. 7 schematically illustrates a superconducting magnet apparatus 400 including a cryogen recondensing system according to another exemplary embodiment.

Referring to FIG. 7, the superconducting magnet apparatus 400 includes a superconducting coil 410 and a cooling system that cools the superconducting coil 410. The cooling system of the exemplary embodiment employs a direct cooling method, such as, a bath type, in which liquid cryogen 470L directly cools the superconducting coil 410 and includes a low-temperature container 420 in which the liquid cryogen 470L is received. The low-temperature container 420 is a water tank in which the liquid cryogen 470L is received, and the superconducting coil 410 is placed under the water level of the liquid cryogen 470L. The upper portion of the low-temperature container 420 protrudes so that an internal space of the low-temperature container 420 forms a recondensing portion 425. The upper portion of the low-temperature container 420, that is, the recondensing portion 425 is cooled by a refrigerator 440. The refrigerator 440 may be a two-stage refrigerator as described above. In this case, the first stage 441 of the refrigerator 440 thermally contacts the heat shield portion 460 and cools the heat shield portion 460, and the second stage 442 thermally contacts the recondensing portion 425 and cools the recondensing portion 425 to re-condense the gas cryogen 470G. The second stage 442 of the refrigerator 440 may be inserted into the inside of the recondensing portion 425 and may directly contact the gas cryogen 470G. The refrigerator 440 cools only the recondensing portion 425, and a separate refrigerator may be provided to cool the heat shield portion 460. A tube (not illustrated) used to introduce or a tube (not illustrated) used to exhaust the cryogen 470 from or into the outside of the superconducting magnet apparatus 400 may be provided in the low-temperature container 420 and a check valve (not illustrated) that opens when an internal pressure reaches a predetermined pressure may be provided in the tube used to exhaust the cryogen 470 like the above-described exemplary embodiment.

The cryogen recondensing system according to the exemplary embodiment further includes a secondary reservoir 450 that accessorily stores the gas cryogen 470G in addition to the recondensing portion 425. The secondary reservoir 450 is spatially separated from the recondensing portion 425 and is connected to the recondensing portion 425 through a secondary reservoir tube 451 and secondary reservoir tube 452. The recondensing portion 425 corresponds to the primary reservoir of the above-described exemplary embodiments.

The cooling system of the exemplary embodiment is substantially identical to the exemplary embodiment described with reference to FIG. 6 except that the primary reservoir in which recondensing occurs is formed integrally with the low-temperature container 420. For example, the secondary reservoir 450 is located in the internal space between the low-temperature container 420 and the heat shield portion 460 and may be thermally shielded by the heat shield portion 460 from external conditions.

In addition, the secondary reservoir 450 may be located at a side portion or a lower portion of the low-temperature container 420. In addition, the secondary reservoir 450 may be located along the outer circumference of the low-temperature container 420. The secondary reservoir 450 is located in the non-occupied space within the heat shield portion 460 without changing the appearance of the heat shield portion 460. The secondary reservoir 450 is spatially separated from the recondensing portion 425 and is connected to the recondensing portion 425 through secondary reservoir tube 451 and secondary reservoir tube 452. Low-temperature reservoir-side inlet-outlet port 426 and inlet-outlet ports 427 connected to the secondary reservoir tube 451 and the secondary reservoir tubes 452 are provided in the recondensing portion 425. The low-temperature reservoir-side inlet-outlet port 426 and inlet-outlet port 427 may be located at a position higher than the pre-designated highest water level of the liquid cryogen 470L of the recondensing portion 425. Although not illustrated, a tube (not illustrated) used to introduce or exhaust the cryogen 470 from or to the outside of the superconducting magnet apparatus 400 may be provided in the recondensing portion 425 and a check valve (not illustrated) that opens when an internal pressure reaches a predetermined pressure may be provided in the tube like the above-described exemplary embodiment.

Like the above-described exemplary embodiment, the secondary reservoir 450 enables the storage capability for the gas cryogen 470G to be larger so as to exceed the capability of the cryogen recondensing system, thereby suppressing a loss in the cryogen 470.

Figure 8:
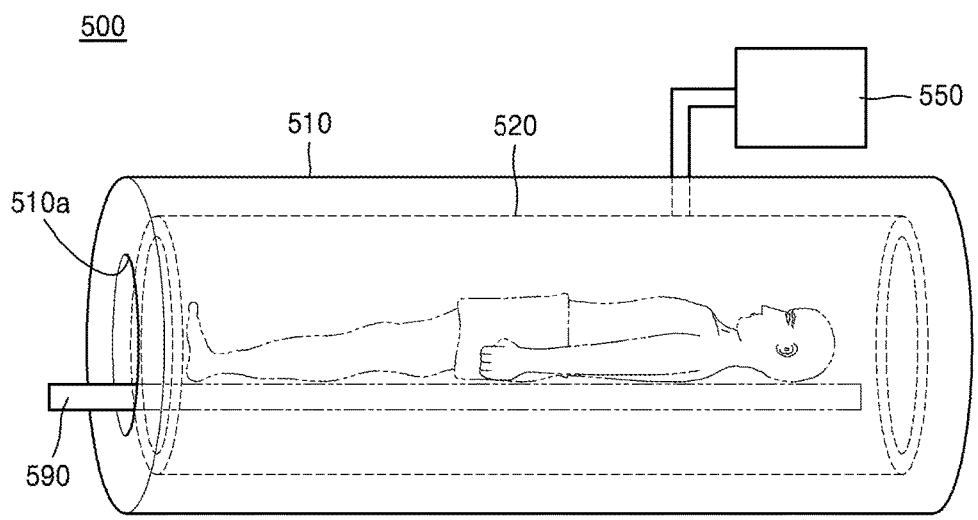
FIG. 8 schematically illustrates an appearance of a horizontal magnetic resonance imaging apparatus, which is an example of the superconducting magnet apparatus of the above-described exemplary embodiments.

FIG. 8 illustrates an appearance of a magnetic resonance imaging apparatus which is an example of the superconducting magnet apparatus of the above-described exemplary embodiments.

Referring to FIG. 8, the superconducting magnet apparatus 500 according to the exemplary embodiment includes a housing 510, a superconducting magnet 520 located within the housing 510, and a cooling pump 550 that cools the superconducting magnet 520. The housing 510 may have a cylindrical structure which includes a bore 510*a*, and the central axis of the cylinder is placed in a horizontal direction. The cylindrical shape of the housing 510 corresponds to the cylindrical shape of the superconducting coil 110 and the superconducting coil 310. The superconducting magnet apparatus 500 of the exemplary embodiment is a horizontal magnetic resonance imaging apparatus in which the central axis of the cylindrical shape of the superconducting coil 110 and the superconducting coil 310 is placed in a horizontal direction.

A table 590 on which a subject lies may have a structure which is moveable so as to be inserted into the bore 510*a*. In addition to the superconducting magnet 520, a gradient coil used to apply a gradient magnetic field to indicate position information of the magnetic field and an RF coil to apply an electromagnetic wave to, for example, a human body, and receive magnetic resonance signals for resonating a magnetization vector within the human body, are provided in the housing 510. The gradient coil or the RF coil for magnetic resonance imaging is well known in the art and exemplary embodiments are not limited thereto. The superconducting magnet apparatus including the cryogen recondensing system of the above-described exemplary embodiments may be applied for the superconducting magnet apparatus 500. The superconducting magnet 110, 310 or 410 or the cooling system of the above-described exemplary embodiments may be included within the housing 510. Since the secondary reservoir 150, 350 or 450 may be located in the non-occupied space within the heat shield portion 160, 360 or 460 as described above, the storage capability for the gas cryogen 170G, 370G or 470G is larger without changing the appearance of the housing 510, thereby suppressing a loss in the cryogen.

Figure 9:
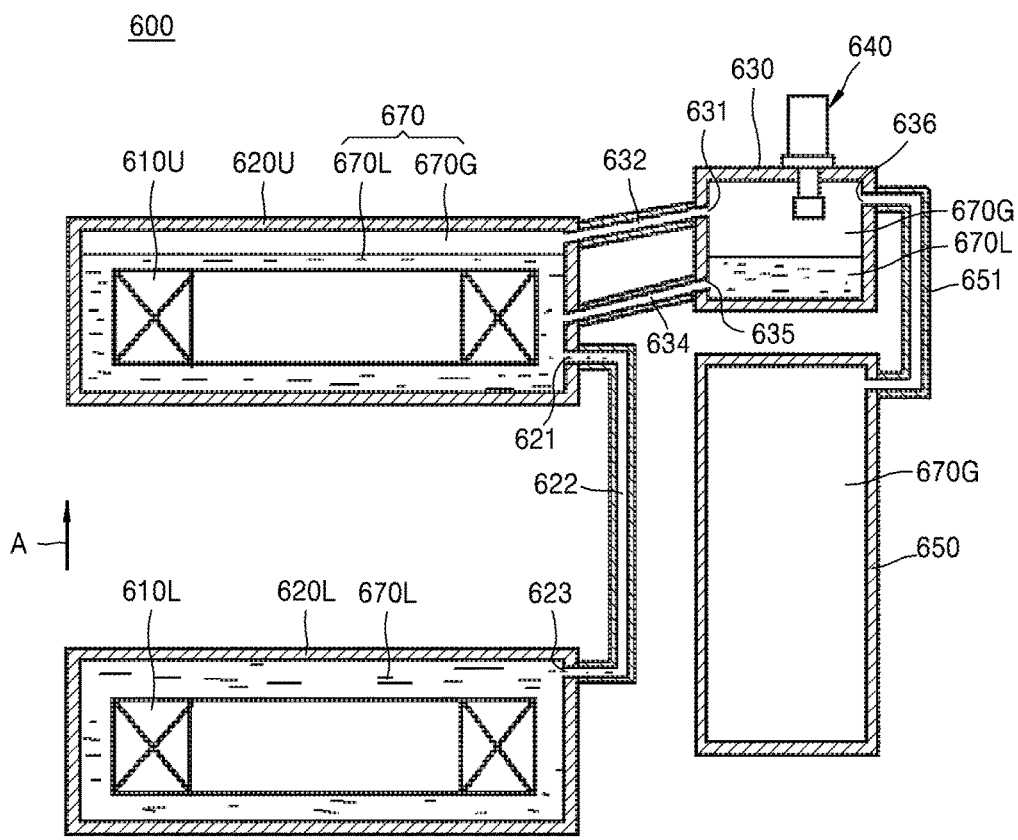
FIG. 9 schematically illustrates a configuration of a cryogen recondensing system according to another exemplary embodiment.
Figure 10:
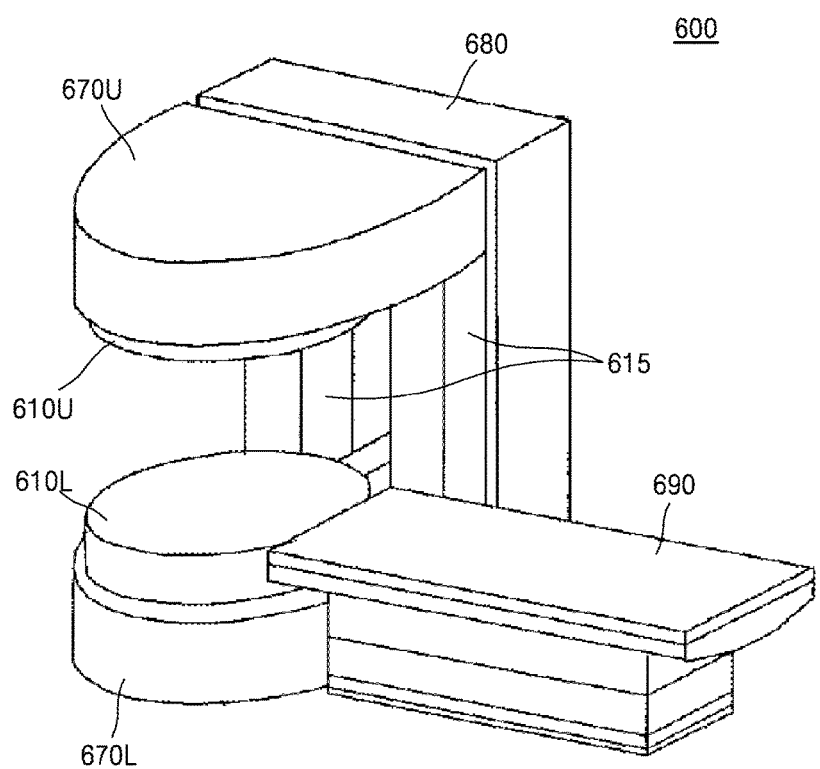
FIG. 10 schematically illustrates an appearance of a superconducting magnet apparatus including the cryogen recondensing system of FIG. 9.

FIG. 9 schematically illustrates a configuration of a cryogen recondensing system according to an exemplary embodiment. FIG. 10 schematically illustrates a configuration of a superconducting magnet apparatus 600 including the cryogen recondensing system of FIG. 9.

Referring to FIGS. 9 and 10, the superconducting magnet apparatus 600 according to the exemplary embodiment is a vertical magnetic resonance apparatus including upper superconducting coil 610U and lower superconducting coils 610L. Upper superconducting coil 610U and lower superconducting coil 610L have a cylindrical shape and their central axis is placed in a vertical direction A. The upper superconducting coil 610U and lower superconducting coil 610L are spaced apart from each other in the vertical direction A.

The superconducting magnet apparatus 600 stores cryogen 670 including liquid cryogen 670L and gas cryogen 670G. The superconducting magnet apparatus 600 cools the upper superconducting coil 610U and lower superconducting coil 610L and includes a cooling system using a cryogen recondensing method. The cooling system uses a direct cooling method, such as, a bath type, in which liquid cryogen 670L directly cools the upper superconducting coil 610U and lower superconducting coil 610L and includes upper low-temperature container 620U and lower low-temperature containers 620L in which the liquid cryogen 670L is received. The upper low-temperature container 620U and lower low-temperature container 620L are connected to each other by a central tube 622 to create a low-temperature container. The central tube 622 includes an inlet-outlet port 621 and inlet-outlet port 623. The upper superconducting coil 610U and lower superconducting coil 610L are placed under the water level of the liquid cryogen 670L within the upper superconducting coil 610U and lower superconducting coil 610L. The liquid cryogen 670L cools the upper superconducting coil 610U and lower superconducting coil 610L to be equal to or lower than a threshold temperature and may be, for example, liquid helium, liquid neon, liquid hydrogen, liquid oxygen, liquid nitrogen, etc. Heat generated from the upper superconducting coil 610U and lower superconducting coil 610L are transferred to the liquid cryogen 670L and the liquid cryogen 670L evaporates. Therefore, the gas cryogen 670G may be collected in the upper portion of the inside of the upper low-temperature container 620U.

Furthermore, the cooling system of the exemplary embodiment includes a primary reservoir 630, that is separated spatially from the upper superconducting coil 610U and lower superconducting coil 610L and re-condenses the gas cryogen 670G, and a refrigerator 640 that cools the primary reservoir 630.

At least a part of the primary reservoir 630 is located at a position higher than the water level of the liquid cryogen 670L within the upper low-temperature container 620U. For example, the primary reservoir 630 may be located at the upper portion of the upper superconducting coil 610U. The upper low-temperature container 620U and the primary reservoir 630 are connected to a first tube 632 and a second tube 634 for low-temperature containers. The primary reservoir 630 includes an inlet port 631 for the low-temperature container and an outlet port 635 for the low-temperature container. The first tube 632 for low-temperature containers connects the upper portion of the upper low-temperature container 620U, which corresponds to the water level of the liquid cryogen 670L, to the upper portion of the primary reservoir 630, thereby becoming a passage for the gas cryogen 670G. The second tube 634 for low-temperature containers connects the side or lower portion of the upper low-temperature container 620U which is lower than the water level of the liquid cryogen 670L to the bottom of the primary reservoir 630, thereby becoming a passage for the liquid cryogen 670L. Although the upper low-temperature container 620U is only connected to the primary reservoir 630 in the exemplary embodiment, exemplary embodiments are not limited thereto.

The lower low-temperature container 620L can also be connected to the primary reservoir 630 directly. In this case, the low-temperature container may be omitted. Like the above-described exemplary embodiment, a tube (not illustrated) used to introduce or a tube (not illustrated) used to exhaust the cryogen 670 from or to the outside of the superconducting magnet apparatus 600 may be provided in the primary reservoir 630 and a check valve (not illustrated) is provided in the tube used to exhaust the cryogen 670, which opens when an internal pressure reaches a predetermined pressure.

The gas cryogen 670G of the primary reservoir 630 is cooled by the refrigerator 640 and is re-condensed. The primary reservoir 630 and the refrigerator 640 constitute a cryogen recondensing system. The cryogen recondensing system of the exemplary embodiment further includes a secondary reservoir 650 that can additionally stores the gas cryogen 670G. The secondary reservoir 650 may be located at the lower portion of the primary reservoir 630. The primary reservoir 630 and the secondary reservoir 650 may be located outside the upper superconducting coil 610U and lower superconducting coil 610L. For example, as illustrated in FIG. 10, a separate mounting space 680. in which the primary reservoir 630 and the secondary reservoir 650 are mounted. may be provided in a part of the upper superconducting coil 610U and lower superconducting coil 610L. Although the secondary reservoir 650 is located in the lower portion in relation to the primary reservoir 630 in the exemplary embodiment, exemplary embodiments are not limited thereto. The secondary reservoir 650 may be located in the upper or side portion of the primary reservoir 530. Although one secondary reservoir 650 is provided in FIG. 9, a plurality of secondary reservoirs may be provided.

The secondary reservoir 650 is spatially separated from the primary reservoir 630 and is connected to the primary reservoir 630 through a secondary reservoir tube 651. A primary reservoir-side inlet-outlet port 636 connected to the secondary reservoir tube 651 is provided in the primary reservoir 630. The primary reservoir-side inlet-outlet port 636 may be located at a position higher than the pre-designated highest water level of the liquid cryogen 670L of the primary reservoir 630. Therefore, the gas cryogen 670G is only introduced into the secondary reservoir 650 and the secondary reservoir tube 651. Although not illustrated, a tube (not illustrated) used to introduce or a tube (not illustrated) used to exhaust the cryogen 670 from or to the outside of the superconducting magnet apparatus 600 may be provided in the primary reservoir 630 and a check valve (not illustrated) that opens when an internal pressure reaches a predetermined pressure may be provided in the tube used to exhaust the cryogen 670 like the above-described exemplary embodiment.

Referring to FIG. 10, a magnetic flux generated by the upper superconducting coil 610U and lower superconducting coil 610L forms a closed loop by a yoke structure including elements 670U, 670L and 615. A table 690 on which a subject lies is located so as to be moveable in a space between the upper superconducting coil 610U and the lower superconducting coil 610L. The upper superconducting coil 610U and lower superconducting coil 610L may be located within a heat shield portion (not illustrated) to be thermally shielded from external conditions. Furthermore, a vacuum container (not illustrated) may be provided outside of the heat shield portion. In the vertical magnetic resonance apparatus, a space on which a subject lies is wide and open, thereby enabling the subject to feel less claustrophobic.

Similar to the above-described exemplary embodiment, the secondary reservoir 650 enables the storage capability for the gas cryogen 670G to be larger so as to exceed the capability of the cryogen recondensing system, thereby suppressing a loss in the cryogen 670.

As described above, according to one or more of the above exemplary embodiments, the cryogen recondensing system and the superconducting magnet apparatus including the cryogen recondensing system increases the storage space (buffer) for gas cryogen, without increasing or changing the appearance of the superconducting magnet apparatus, thereby reducing a loss of cryogen.

A cryogen recondensing system and a superconducting magnet apparatus including the cryogen recondensing system according to exemplary embodiments have been described with reference to the drawings. However, those of ordinary skill in the art will understand that the exemplary embodiments are merely exemplary and various modifications may be made therein. Therefore, the scope of the inventive concept should be defined by the appended claims.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the inventive concept as defined by the following claims.

What is claimed is:

1. A cryogen recondensing system comprising:
    a primary reservoir configured to store cryogen for cooling a superconducting coil;
    a heat shield portion configured to thermally shield the superconducting coil from external conditions;
    a first refrigerator configured to cool the heat shield portion at a first temperature;
    a second refrigerator configured to recondense gas cryogen of cryogen stored in the primary reservoir at a second temperature, the second temperature being lower than the first temperature;
    a secondary reservoir configured to store gas cryogen; and
    a secondary reservoir tube configured to connect the primary reservoir to the secondary reservoir, and wherein the gas cryogen flows through the secondary reservoir tube,
    wherein the primary reservoir and the secondary reservoir are located inside of the heat shield portion, and the primary reservoir and the secondary reservoir are thermally shielded by the heat shield portion from the external conditions, and
    wherein all outside surfaces of the secondary reservoir are spatially separated from the heat shield portion.

2. The cryogen recondensing system of claim 1, wherein the primary reservoir includes a primary reservoir-side inlet-outlet port connected to the secondary reservoir tube, and wherein the primary reservoir-side inlet-outlet port is located at a position higher than a pre-designated highest liquid level of liquid cryogen in the primary reservoir.

3. The cryogen recondensing system of claim 1, wherein the secondary reservoir is located lower than the primary reservoir in the cryogen recondensing system.

4. The cryogen recondensing system of claim 1, wherein the secondary reservoir tube has a pipe shape.

5. The cryogen recondensing system of claim 1, wherein the secondary reservoir tube is formed by extending a part of the primary reservoir or the secondary reservoir.

6. The cryogen recondensing system of claim 1, wherein a single secondary reservoir tube or a plurality of secondary reservoir tubes are provided in the cryogen recondensing system.

7. The cryogen recondensing system of claim 1, wherein a single secondary reservoir or a plurality of secondary reservoirs are provided in the cryogen recondensing system.

8. The cryogen recondensing system of claim 1, further comprising a check valve connected to the primary reservoir that is configured to open at a predetermined pressure value.

9. The cryogen recondensing system of claim 1, wherein the cryogen is any one from among helium, neon, oxygen, hydrogen, and nitrogen.

10. A superconducting magnet apparatus comprising:
a superconducting coil; and
a cooling system comprising a cryogen recondensing system that is configured to cool the superconducting coil,
wherein the cryogen recondensing system comprises:
    a primary reservoir configured to store cryogen for cooling the superconducting coil;
    a heat shield portion configured to thermally shield the superconducting coil from external conditions;
    a first refrigerator configured to cool the heat shield portion at a first temperature;
    a second refrigerator configured to recondense gas cryogen of cryogen stored in the primary reservoir at a second temperature, the second temperature being lower than the first temperature;
    a secondary reservoir configured to store gas cryogen; and
    a secondary reservoir tube configured to connect the primary reservoir to the secondary reservoir, and wherein the gas cryogen flows through the secondary reservoir tube,
wherein the primary reservoir and the secondary reservoir are located inside of the heat shield portion, and the primary reservoir and the secondary reservoir are thermally shielded by the heat shield portion from the external conditions, and
wherein all outside surfaces of the secondary reservoir are spatially separated from the heat shield portion.

11. The superconducting magnet apparatus of claim 10, wherein the cooling system comprises:
a superconducting coil cooler through which the cryogen flows and is configured to thermally contact the superconducting coil and is configured to cool the superconducting coil; and
a superconducting coil cooler tube configured to connect the primary reservoir to the superconducting coil cooler.

12. The superconducting magnet apparatus of claim 11, wherein the superconducting coil cooler operates according to a thermosyphon method.

13. The superconducting magnet apparatus of claim 10, wherein the cooling system further comprises a low-temperature container configured to receive the cryogen, and wherein the low-temperature container is configured to receive and cool the superconducting coil.

14. The superconducting magnet apparatus of claim 13, wherein the primary reservoir through which gas cryogen flows is connected to a first low-temperature container tube which is spatially separated from the low-temperature container, and wherein the primary reservoir is connected to a second low-temperature container tube through which recondensed liquid cryogen flows.

15. The superconducting magnet apparatus of claim 13, wherein the low-temperature container is integrated with the primary reservoir.

16. The superconducting magnet apparatus of claim 10, wherein the superconducting coil has a cylindrical shape in which a central axis of the superconducting coil is positioned in a horizontal direction.

17. The superconducting magnet apparatus of claim 16, wherein the secondary reservoir is located along a circumference of the superconducting coil.

18. The superconducting magnet apparatus of claim 10, wherein the superconducting coil has a cylindrical shape in which a central axis of the superconducting coil is positioned in a vertical direction.

19. The superconducting magnet apparatus of claim 10, wherein the superconducting magnet apparatus is a magnetic resonance imaging apparatus.

* * * * *